(12) United States Patent
Shionoiri et al.

(10) Patent No.: US 7,158,439 B2
(45) Date of Patent: Jan. 2, 2007

(54) MEMORY AND DRIVING METHOD OF THE SAME

(75) Inventors: Yutaka Shionoiri, Isehara (JP); Tomoaki Atsumi, Isehara (JP); Kiyoshi Kato, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 140 days.

(21) Appl. No.: 10/890,173

(22) Filed: Jul. 14, 2004

(65) Prior Publication Data

US 2005/0047266 A1    Mar. 3, 2005

(30) Foreign Application Priority Data

Aug. 11, 2003 (JP) .............................. 2003-291811

(51) Int. Cl.
*G11C 8/00* (2006.01)
(52) U.S. Cl. .................................... 365/230.06; 365/94
(58) Field of Classification Search .................. 365/94, 365/230.06
See application file for complete search history.

(56) References Cited

U.S. PATENT DOCUMENTS 5,297,029 A * 3/1994 Nakai et al. ............. 365/238.5
6,741,487 B1 * 5/2004 Yokozeki ................... 365/63
2001/0030323 A1 * 10/2001 Ikeda ........................ 257/59

FOREIGN PATENT DOCUMENTS

| JP | 05-166381 | | 7/1993 | |
| JP | 06-020484 | * | 1/1994 | ............. 365/94 |
| JP | 07-065594 | | 3/1995 | |

* cited by examiner

*Primary Examiner*—Hoai V. Ho
(74) *Attorney, Agent, or Firm*—Eric J. Robinson; Robinson Intellectual Property Law Office, P.C.

(57) ABSTRACT

A memory having a bit line, a word line crossing the bit line, a memory cell electrically connected to the bit line and to the word line, a column decoder and a selector including a clocked inverter having a plurality of transistors electrically connected in series between a first power source and a second power source is provided. An input node of the clocked inverter is connected to the bit line, an output node of the clocked inverter is electrically connected to a data line, the plurality of transistors comprise a P-type transistor and a N-type transistor, a gate electrode of the P-type transistor and a gate electrode of the N-type transistor are electrically connected to the column decoder, and a sense amplifier is not interposed between the bit line and the input node of the clocked inverter.

23 Claims, 5 Drawing Sheets

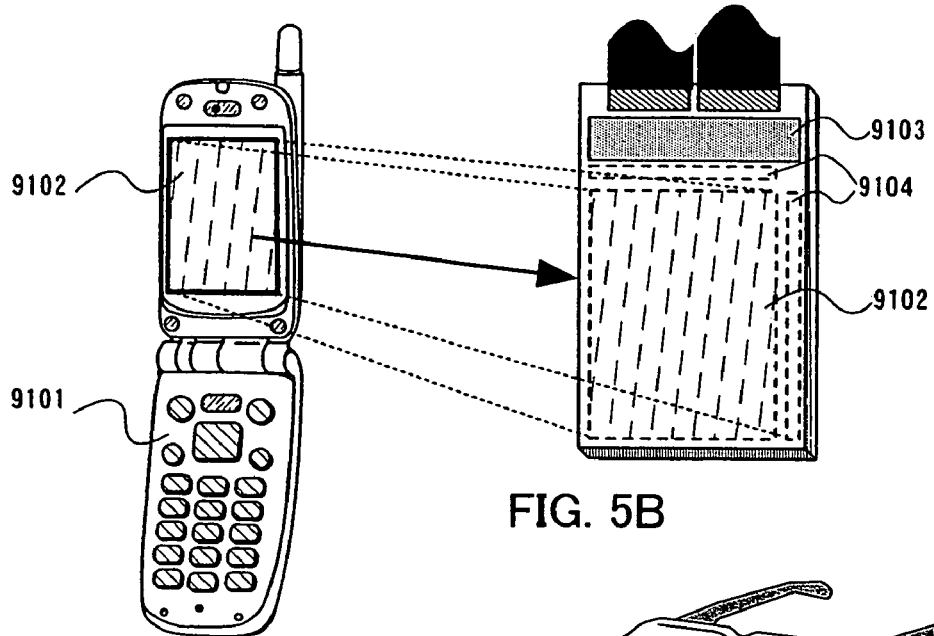
FIG. 5B
FIG. 5A
FIG. 5D
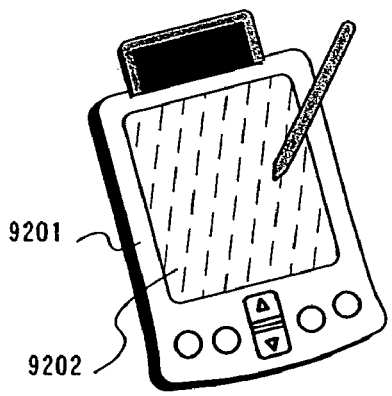
FIG. 5C
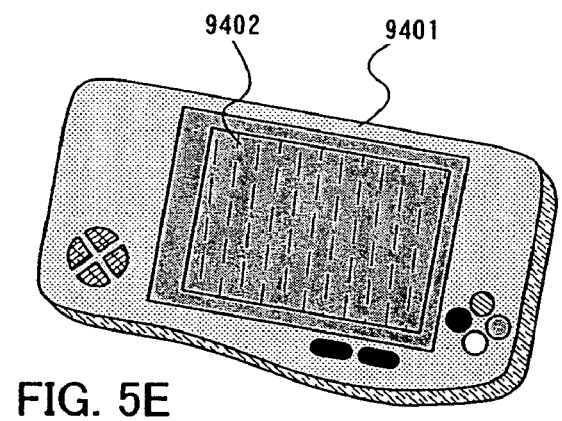
FIG. 5E
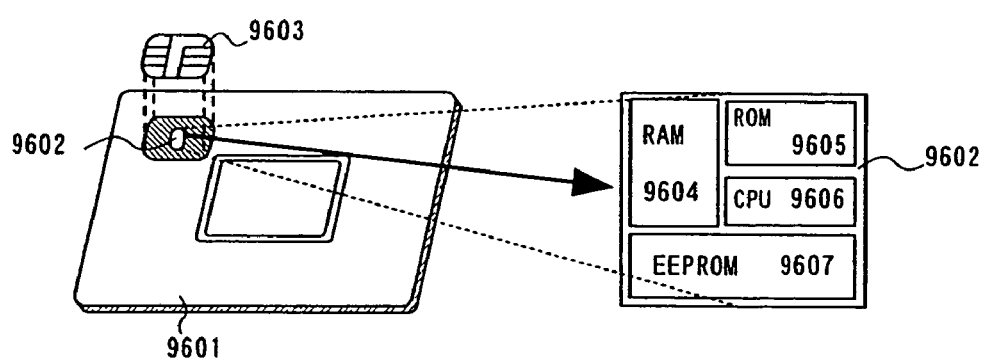
FIG. 5F

MEMORY AND DRIVING METHOD OF THE SAME

BACKGROUND OF THE INVENTION

1. Field of the Invention

The present invention relates to a memory and a driving method thereof. More particularly, the invention relates to a memory provided with a selector including a clocked inverter and a driving method thereof.

2. Description of the Related Art

In recent years, a memory is applied to a variety of fields such as a computer, a portable terminal, an IC card and further development is actively carried out. A memory comprises a plurality of memory cells arranged in matrix and peripheral circuitry including an output circuit.

Some memories comprise a clocked inverter and a transistor which balances the potentials of an input node and an output node of the clocked inverter at an intermediate potential by short-circuiting both nodes and releases the short-circuit at the start of data transmission (For example, refer to Patent Document 1.). Further, the other circuits comprise a clocked inverter as a circuit for amplifying a signal outputted from each memory cell (For example, refer to Patent Document 2.).

[Patent Document 1] Japanese Patent Laid-Open No. Hei5-166381 (first and fourth pages, FIGS. 1 and 2)

[Patent Document 2] Japanese Patent Laid-Open No. Hei7-65594 (first page and FIG. 4)

SUMMARY OF THE INVENTION

These and other objects, features and advantages of the present invention will become more apparent upon reading of the following detailed description along with the accompanied drawings.

In Patent Document 1, a memory cell read amplifier and a transistor for releasing a short-circuit of an input node and an output node of a clocked inverter is provided between a memory cell and the clocked inverter. Therefore, as the number of elements increases, mounting area expands and the reliability decreases.

In Patent Document 2, a clocked inverter used as a sense amplifier is controlled by an input select signal which is supplied from outside. Thus, more burden is imposed upon peripheral circuitry.

According to the invention, mounting area is decreased and the yield is improved by decreasing the number of elements, and further a memory with less burden on peripheral circuitry and a driving method thereof are provided.

A memory (ROM) of the invention comprises a memory cell including a memory element in a region where a bit line and a word line cross with an insulator interposed between them, a column decoder, and a selector including a clocked inverter An input node of the clocked inverter is connected to the bit line and an output node is connected to a data line. Among a plurality of transistors connected in series which form the clocked inverter, a gate of a P-type transistor of which source or drain is connected to a power source on the high potential side VDD and a gate of an N-type transistor of which source or drain is connected to a power source on the low potential side VSS are connected to the column decoder.

The memory element is formed by one or both of one or a plurality of transistors and one or a plurality of capacitors. That is, a memory element is formed by one or a plurality of elements. In the invention, elements disposed in a memory cell are referred to as memory elements collectively. Specific configuration of the memory element is dependent on the kind of memory.

The clocked inverter comprises two N-type transistors and two P-type transistors connected in series. The configuration of. the clocked inverter is described with reference to FIGS. 1C and 1D.

FIG. 1C is a logic symbol of a clocked inverter comprising four nodes which are three input nodes and one output node specifically. Here, signals Va, Vb, and Vc are inputted to the three input nodes and a signal Vout is outputted from the output node.

FIG. 1D is an equivalent circuit diagram of a clocked inverter, in which a P-type transistor 16 of which source or drain is connected to a power source on the high potential side VDD is disposed at one end and an N-type transistor 19 of which source or drain is connected to a power source on the low potential side VSS is disposed at the other end. In this manner, a gate of the P-type transistor 16 disposed at one end and a gate of the N-type transistor 19 disposed at the other end correspond to input nodes, which are inputted with signals Vb and Vc respectively.

Each gate of a P-type transistor 17 and an N-type transistor 18 which are not directly connected to either the power source on the high potential side or the power source on the low potential side is connected to each other. These gates which are connected to each other correspond to an input node, which is inputted with a signal Va. Each drain of the P-type transistor 17 and the N-type transistor 18 is connected to each other. These drains which are connected to each other correspond to an output node, which outputs a signal Vout.

The aforementioned memory may include an inverter in the selector. In that case, one of the gates of the P-type transistor and the N-type transistor is directly connected to the column decoder and the other is connected to the column decoder via the inverter.

A memory (RAM) of the invention comprises a memory cell including a memory element in a region where a bit line and a word line cross with an insulator interposed between them, a column decoder, and a selector including a first switch (preferably an analog switch) and a clocked inverter, and a Read/Write circuit including second and third switches (preferably analog switches).

The bit line is connected to a data line via the clocked inverter and the second switch or via the first and third switches.

Each gate of one or a plurality of transistors of the first switch is connected to the column decoder, each gate of one or a plurality of transistors of the second switch is electrically connected to a Read Enable signal line, and each gate of one of a plurality of transistors of the third switch is electrically connected to a Write Enable signal line.

The Read/Write circuit controls an input and an output of data (write/read). The Read Enable (RE) signal line corresponds to a wiring for transferring a Read Enable signal (RE signal) and controls an output (read) of data. The Write Enable (WE) signal line corresponds to a wiring for transferring a Write Enable signal (WE signal) and controls an input (write) of data.

In the aforementioned configuration, the Read/Write circuit may include first and second logic circuits (preferably NORs). One of two input nodes of the first logic circuit is connected to the Read Enable signal line, the other is connected to a Chip Enable (CE) signal line, and an output node is connected to the second switch. Further, one of two input nodes of the second logic circuit is connected to the Write Enable signal line, the other is connected to the Chip Enable signal line, and an output node is connected to the third switch. The Chip Enable signal line corresponds to a wiring for transferring a Chip Enable signal (CE signal) and controls selection/non-selection (operation/non-operation) of the memory.

According to the invention having the aforementioned configuration, a clocked inverter is included in peripheral circuitry such as a selector and a Read/Write circuit, and an input node of the clocked inverter is connected to a bit line. Further, gates of transistors disposed at one end and the other end of the clocked inverter are connected to the column decoder. In other words, among a plurality of transistors configuring the clocked inverter, a gate of a transistor of which source or drain is connected to a power source on the high potential side and a gate of a transistor of which source or drain is connected to a power source on the low potential side are connected to the column decoder.

A driving method of the memory (ROM) of the invention is that the clocked inverter is put into an operating state by inputting a signal from the column decoder to each gate of the P-type transistor and the N-type transistor, a data signal is inputted from the memory cell to the input node of the clocked inverter via the bit line, and an amplified data signal is outputted from the output node of the clocked inverter.

A driving method of the memory (RAM) of the invention is that the clocked inverter is put into an operating state to make the first switch conductive by inputting a signal from the column decoder to the first switch, a gate of a P-type transistor of which source or drain is connected to a power source on the high potential side, and a gate of an N-type transistor of which source or drain is connected to a power source on the low potential side among the plurality of transistors configuring the clocked inverter. It is possible in this state to read or write the selected memory cell.

When reading the memory cell, a Read Enable signal is inputted to make a second switch conductive and a Write Enable signal is inputted to make a third switch non-conductive. A data signal is inputted from the memory cell to an input node of the clocked inverter via the bit line and an amplified data signal is outputted from an output node of the clocked inverter.

When writing the memory cell, a Read Enable signal is inputted to make the second switch non-conductive and a Write Enable signal is inputted to make the third switch conductive. A data signal is inputted from a data line to the memory cell via the first and third switches and the bit line.

According to the invention having the aforementioned configuration, state of the clocked inverter is controlled by a signal supplied from the column decoder. When the clocked inverter is changed from the non-operating state (high impedance state, unstable state, or floating state) to an operating state, a bit line connected to the input node of the clocked inverter is selected. Further, a signal outputted from the memory cell is amplified by the clocked inverter. Therefore, selection of the bit line and amplification of a signal supplied from the memory cell can be carried out simultaneously by the clocked inverter.

According to the invention in which the selection of the bit line and the amplification of a signal supplied from the memory cell are carried out simultaneously, reading speed of a memory is drastically increased. Compared to a sense amplifier which is used as an amplifier circuit of a memory in many cases, the invention using a clocked inverter having a small number of elements can contribute to improve the yield. Also, mounting area can be reduced due to the reduced number of elements, which allows further downsizing and weight saving. Furthermore, when compared to the case of using a sense amplifier which requires two inputs, the invention using a clocked inverter with one input can reduce the burden imposed upon peripheral circuitry because of the reduced signals to be controlled, which allows to reduce the number of lead wirings, for example.

BRIEF DESCRIPTION OF THE DRAWINGS

FIGS. 5A to 5E are views of electronic apparatuses and FIG. 5F is a view of an IC card to which the invention is applied.

DETAILED DESCRIPTION OF THE INVENTION

[Embodiment Mode 1]

Figure 1A:
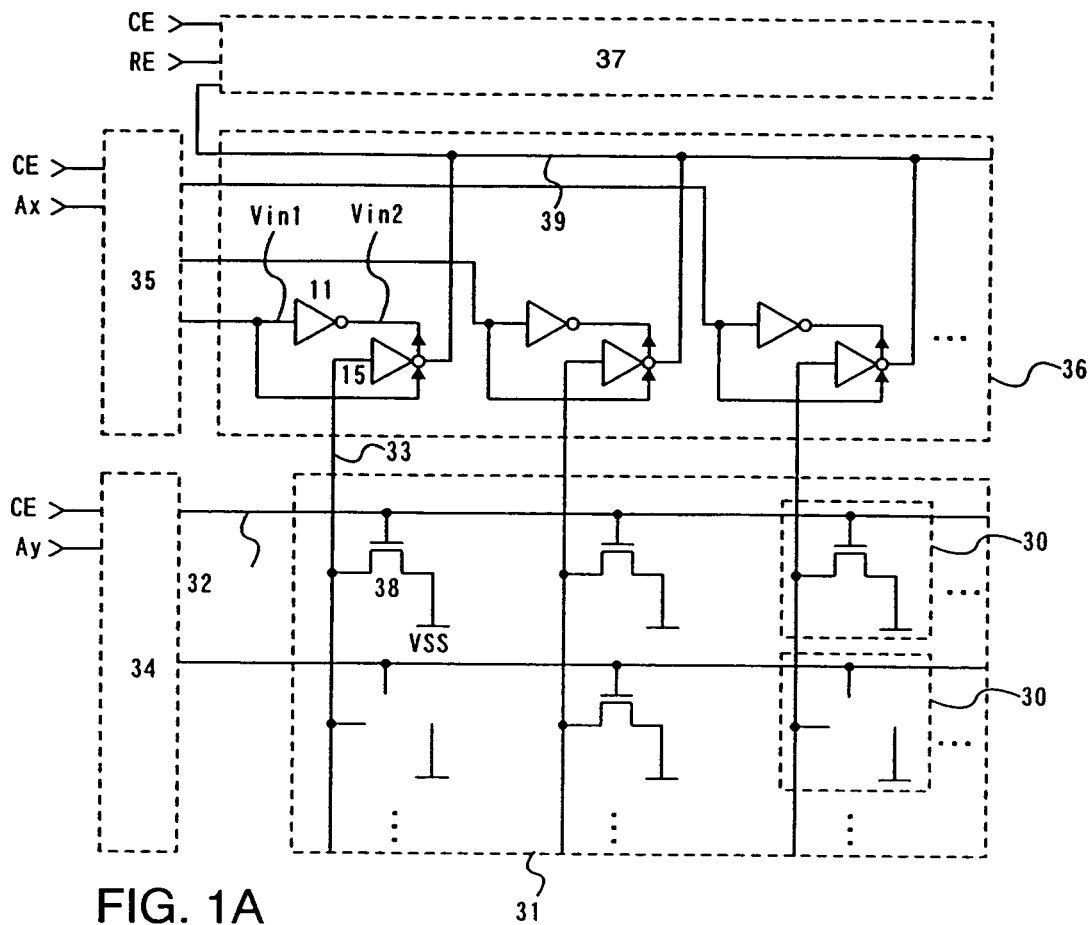
FIGS. 1A to 1D are diagrams showing the memory (Read Only Memory) of the invention and a driving method thereof (Embodiment Mode 1).

A configuration of a read only memory (typically a ROM) is described with reference to FIG. 1A as the memory of the invention.

The memory of the invention is provided with a memory cell array 31 in which memory cells 30 are arranged in matrix (in rows and columns). Further, a row decoder 34, a column decoder 35, a selector 36 and an output circuit 37 are provided, which control the operations of the memory cells 30.

The row decoder 34 is inputted with a Chip Enable signal (hereinafter referred to as a CE signal or CE) and an Ay signal. The column decoder 35 is inputted with a CE signal and an Ax signal. Note that a Read Enable signal (hereinafter referred to as an RE signal or RE) may be inputted to the both decoders although it is not shown.

The selector 36 is provided with an inverter 11 and a clocked inverter 15. The inverter 11 and the clocked inverter 15 are provided in each column corresponding to each bit line 33.

The clocked inverter 15 is formed by two N-type transistors and two P-type transistors connected in series. A gate of the N-type transistor disposed at one end is connected to an input node of the inverter 11 and a source or a drain thereof is connected to a power source on the low potential side VSS (not shown). A gate of the P-type transistor disposed at the other end is connected to an output node of the inverter 11 and a source or a drain thereof is connected to a power source on the high potential side VDD (not shown). An input node of the clocked inverter 15 is connected to the bit line 33 while an output node thereof is connected to a data line 39. A specific configuration of the clocked inverter 15 is shown in FIGS. 1C and 1D, which may be referred at discretion.

An output circuit 37 is inputted with a CE signal and an RE signal, and a data signal via the data line 39.

Each memory cell 30 comprises a memory element in a region where a word line 32 and a bit line 33 cross. The memory element corresponds to one or both of one or a plurality of transistors and one or a plurality of capacitors. The memory cells 30 comprise a variety of configurations. In that case of a ROM, each memory cell 30 has one transistor 38 as a memory element. In the case of using a mask ROM in which memory content is stored in the memory in the manufacturing phase, "0" and "1" are distinguished in that a transistor exists in the cell or not, therefore, some memory cells do not have transistors. In that case, the bit line 33 is required to be precharged to a higher potential than VDD/2.

In the case of using the mask ROM, "0" and "1" can be distinguished by connecting a transistor to either a power source on the low potential side VSS or a power source on the high potential side VDD, as a different method than the aforementioned method of storing memory content in the memory in the manufacturing phase. The configuration of the memory is not limited to the aforementioned description, but a precharge circuit for setting a potential of a wiring in advance, a level shifter for amplifying a potential difference between signals, an input buffer for amplifying a potential difference between signals to be inputted and the like may be provided as well.

According to the memory of the invention, a gate of a P-type transistor of which source or drain is connected to a power source on the high potential side and a gate of an N-type transistor of which source or drain is connected to a power source on the low potential side are connected to the column decoder 35 directly or via the inverter 11, and the bit line 33 is connected to the input node of the clocked inverter 15. These two features ensure that the selection of a bit line and the amplification of a signal outputted from the memory cell are carried out by one clocked inverter.

Next, an operation in the case of reading data of the memory having the aforementioned configuration is described. Here, an operation in the case of reading the memory cell 30 disposed at coordinates (x, y). x and y are natural numbers here.

It should be noted that the potential of an output node of the column decoder 35 which corresponds to x-th column is Ax and the potential of an output node of the row decoder 34 which corresponds to y-th row is Ay in FIG. 1A. The output node of the column decoder 35, the input node of the inverter 11, and an input node of an N-type transistor which is disposed at one end of the clocked inverter 15 and of which source or drain is connected to a power source on the high potential side are connected to each other and the potential of these is Vin1.

Figure 1B:
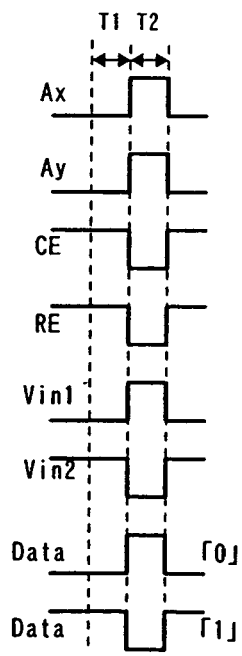
Figure 1C:
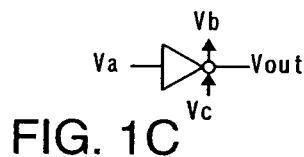
Figure 1D:
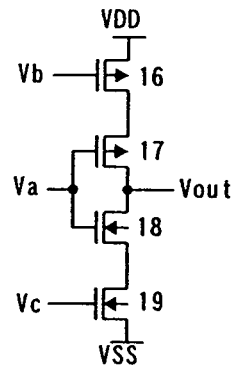

The output node of the inverter 11 and an input node of a P-type transistor which is disposed at the other end of the clocked inverter 15 and of which source or drain is connected to a power source on the high potential side are connected to each other and the potential of these is Vin2. Further, the potential of the data line 39 is Data. FIG. 1B is a timing chart showing the changes over time of the aforementioned Ax, Ay, CE, RE, Vin1, Vin2, and Data. Hereinafter described are operations in a period T2 in which data is read from the memory cells 30 and other period T1.

In the period T1, a signal of L-level is supplied from the column decoder 35 to an input node of the inverter 11 of x-th column. A signal of L-level is supplied from the row decoder 34 to the word line 32 of y-th row.

When a signal of L-level is inputted to an input node of the inverter 11, a signal of H-level is outputted from an output node (Vin2) of the inverter 11.

As Vin1 is L-level and Vin2 is H-level, the P-type transistor disposed at one end of the clocked inverter 15 and the N-type transistor disposed at the other end thereof are both turned OFF and the clocked inverter 15 is put into a high impedance state (unstable state, floating state). In this manner, a signal is not read out from the memory cell 30 disposed in a column of which clocked inverter 15 is in a high impedance state.

In the period T2, a signal of H-level is supplied from the column decoder 35 to an input node of the inverter 11 of x-th column. A signal of H-level is supplied from the row decoder 34 to the word line 32 of y-th row. Then, the word line 32 disposed in y-th column is selected.

When a signal of H-level is inputted to an input node of the inverter 11, a signal of L-level is outputted from an output node (Vin2) of the inverter 11.

As Vin1 is H-level and vin2 is L-level, the P-type transistor disposed at one end of the clocked inverter 15 and the N-type transistor disposed at the other end thereof are both turned ON and the clocked inverter 15 is put into an operating state. In the operating state, which is a state opposite to a high impedance state, a signal is outputted from an output node when a signal is inputted to an input node. In this state, a signal is read from the memory cell disposed at coordinates (x, y).

In the case where the data signal read from the memory cell 30 is H-level ("1"), a signal of L-level is outputted to the data line 39. In the case where the data signal read out from the memory cell 30 is L-level ("0"), a signal of H-level is outputted to the data line 39. In this manner, a clocked inverter in the operating state functions simply as an inverter, therefore, change between H-level and L-level is accurately carried out. That is, variations in characteristics of transistors is not much reflected on an output.

A signal outputted from the clocked inverter 15 has the same potential as a power source on the high potential side VDD or a power source on the low potential side VSS. That is, a data signal supplied from the memory cell 30 is amplified by passing through the clocked inverter 15 and the amplified data signal is outputted to the output circuit 37.

According to the invention, a state (unstable state or operating state) of the clocked inverter 15 is controlled by a signal supplied from the column decoder 35. When the clocked inverter 15 changes from the unstable state to the operating state, the bit line 33 connected to an input node of the clocked inverter 15 is selected. Further, a signal outputted from the memory cell 30 is amplified by the clocked inverter 15 and outputted to the output circuit 37.

That is, it is one of the features of the invention that the selection of the bit line and the amplification of the signal supplied from the memory cell are carried out by one clocked inverter 15. In many cases, a column decoder is provided only for selecting a bit line, and a sense amplifier and the like are provided as amplifier circuits. Therefore, according to the invention in which the selection of the bit line and the amplification of the signal supplied from the memory cell are carried out by a clocked inverter simultaneously, reading speed of a memory is drastically increased.

Compared to a sense amplifier which is used as an amplifier circuit of a memory in many cases, the invention using a clocked inverter having a small number of elements can contribute to improve the yield. Also, mounting area can be reduced due to the reduced number of elements.

Furthermore, when compared to the case of using a sense amplifier which requires two inputs, the invention using a clocked inverter with one input can reduce the burden imposed upon peripheral circuitry because of the reduced signals to be controlled, which allows to reduce the number of lead wirings, for example, and the reliability is improved.

It should be noted that in the timing chart of FIG. 1B, the potential of the data line 39 falls from H-level to L-level or rises from L-level to H-level in concurrence with the clocked inverter 15 changing from the unstable state to the operating state. In practice, however, there are a delay of a signal supplied from the column decoder 35 and a delay generated when a circuit configuring the output circuit 37 changes from the unstable state to the operating state.

The signal outputted from the memory cell 30 is inverted by passing through the clocked inverter 15. Such an inverted signal passes through an inverter (not shown) provided in the output circuit 37 to adjust the logic.

[Embodiment Mode 2]

Figure 2:
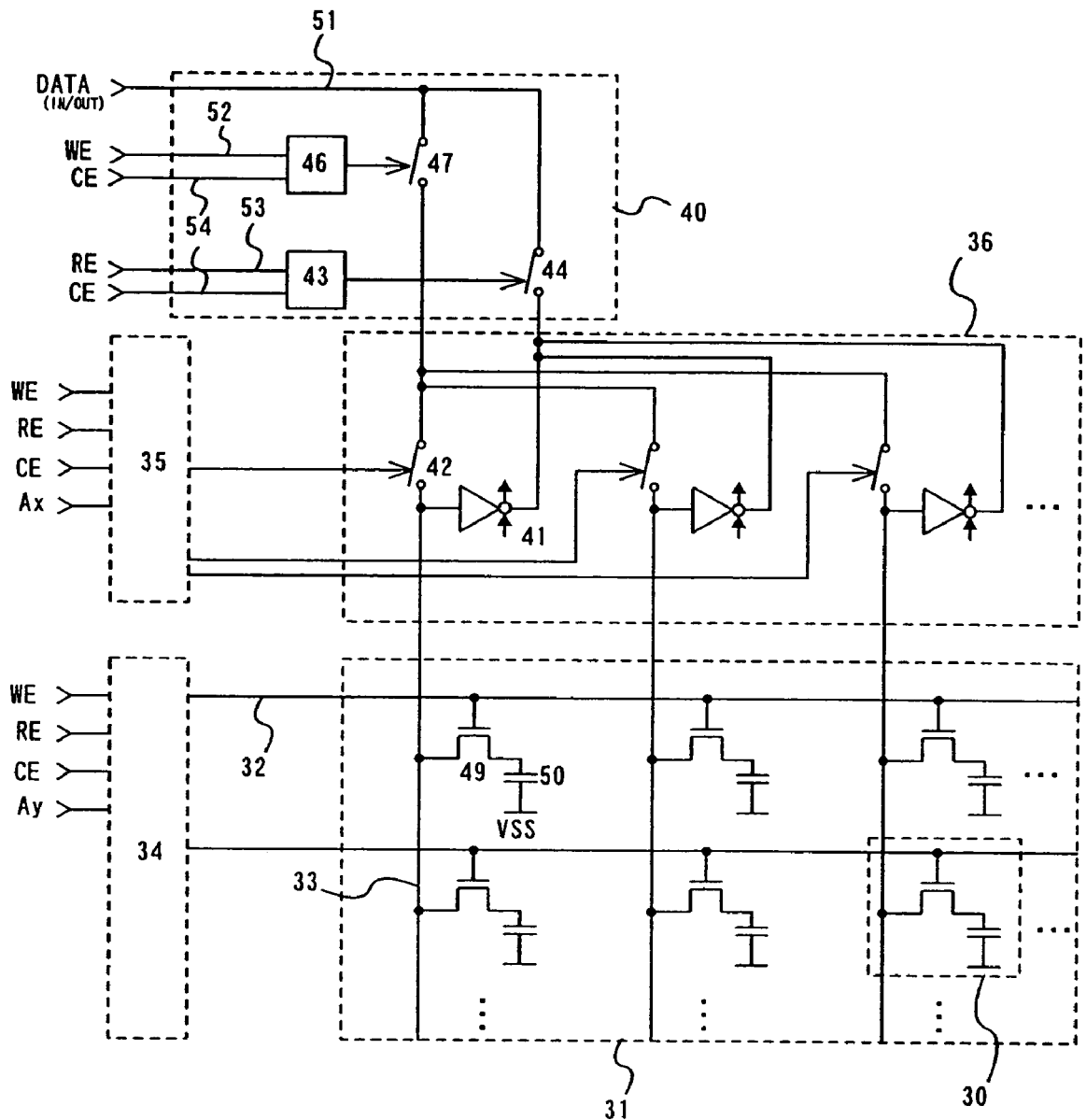
FIG. 2 is a diagram showing the memory (Read/Write memory) of the invention and a driving method thereof (Embodiment Mode 2).

A configuration of a memory which is capable of reading and writing (typically a RAM) is described briefly with reference to FIG. 2 as the memory of the invention.

The memory of the invention comprises a memory cell array 31 in which memory cells 30 are arranged in matrix, a row decoder 34, a column decoder 35, a selector 36 and a Read/Write circuit (hereinafter referred to as a R/W circuit) 40. The selector 36 is provided with a clocked inverter 41 and a switch 42. The clocked inverter 41 and the switch 42 are provided in each column corresponding to each bit line 33. That is, assuming that the clocked inverter 41 and the switch 42 are one unit circuit, one unit circuit is provided corresponding to each bit line. Therefore, two unit circuits are provided in each column in the case where two bit lines (one is a bit line and the other is a bit bar line) are provided in each column.

The row decoder 34 is inputted with a Write Enable signal (hereinafter referred to as a WE signal or WE), a Read Enable signal (hereinafter referred to as an RE signal or RE), a Chip Enable signal (hereinafter referred to as a CE signal or CE), and an Ay signal. The column decoder 35 is inputted with a WE signal, an RE signal, a CE signal and an Ax signal.

The R/W circuit 40 comprises logic circuits 43 and 46, and switches 44 and 47. Further, a data line 51, a Write Enable signal line (hereinafter referred to as a WE signal line) 52, a Read Enable signal line (hereinafter referred to as an RE signal line) 53, and a Chip Enable signal line (hereinafter referred to as a CE signal line) 54 are disposed in the R/W circuit 40. The data line 51 is a wiring for transferring a data signal to write each memory cell 30 and a data signal read out from each memory cell 30. The WE signal line 52 is a wiring for transferring a WE signal, the RE signal line 53 is a wiring for transferring an RE signal, and the CE signal line 54 is a wiring for transferring a CE signal. The aforementioned WE signal, RE signal, and CE signal are inputted to the column decoder 35 and the row decoder 34 as well.

As for each of two input nodes of the logic circuits 43 and 46, one is connected to the CE signal line 54 and the other is connected to the WE signal line 52 or the RE signal line 53. The switches 44 and 47 are controlled by the signals outputted from the logic circuits 43 and 46 so that one becomes conductive while the other becomes non-conductive.

Each memory cell 30 comprises one or a plurality of memory elements in a region where the word line 32 and the bit line 33 cross. A DRAM, for example, comprises a capacitor 50 using an oxide film and a transistor 49 which controls writing or reading of data of the capacitor 50. FIG. 2 shows the case where the memory cells 30 configure a DRAM.

As a different configuration than the aforementioned, each memory cell 30 comprises a transistor having two gates which are a floating gate and a gate in the case of a flash memory. In the case of an FRAM, each memory cell 30 comprises a transistor and a capacitor using a ferroelectric substance. In the case of an SRAM, each memory cell 30 comprises five transistors or four transistors and one resistor. However, in the case where two bit lines (one is a bit line and the other is a bit bar line) are disposed in each column of SRAM, each memory cell 30 comprises six transistors or four transistors and two resistors. It should be noted that in the case where two bit lines are disposed in each column, the clocked inverter 41 and the switch 42 are provided corresponding to each bit line 33 in the selector 36.

The configuration of the memory is not limited to the aforementioned one, but a precharge circuit, a level shifter, an input buffer and the like may be provided as well.

The features of the memory of the invention include that the switch 42 is controlled by a signal supplied from the column decoder 35, the input node of the clocked inverter 41 is connected to the bit line 33, and the switches 44 and 47 are controlled by the RE signal, WE signal and CE signal. These features ensure that the selection of a bit line and the amplification of a signal outputted from the memory cell are carried out by one clocked inverter.

Next, the operations of the memory having the aforementioned configuration when reading data and when writing data are described with reference to FIGS. 3A and 3B. Here, the operations of the memory cell 30 disposed at coordinates (x, y) when reading data and when writing data are described.

Figure 3A:
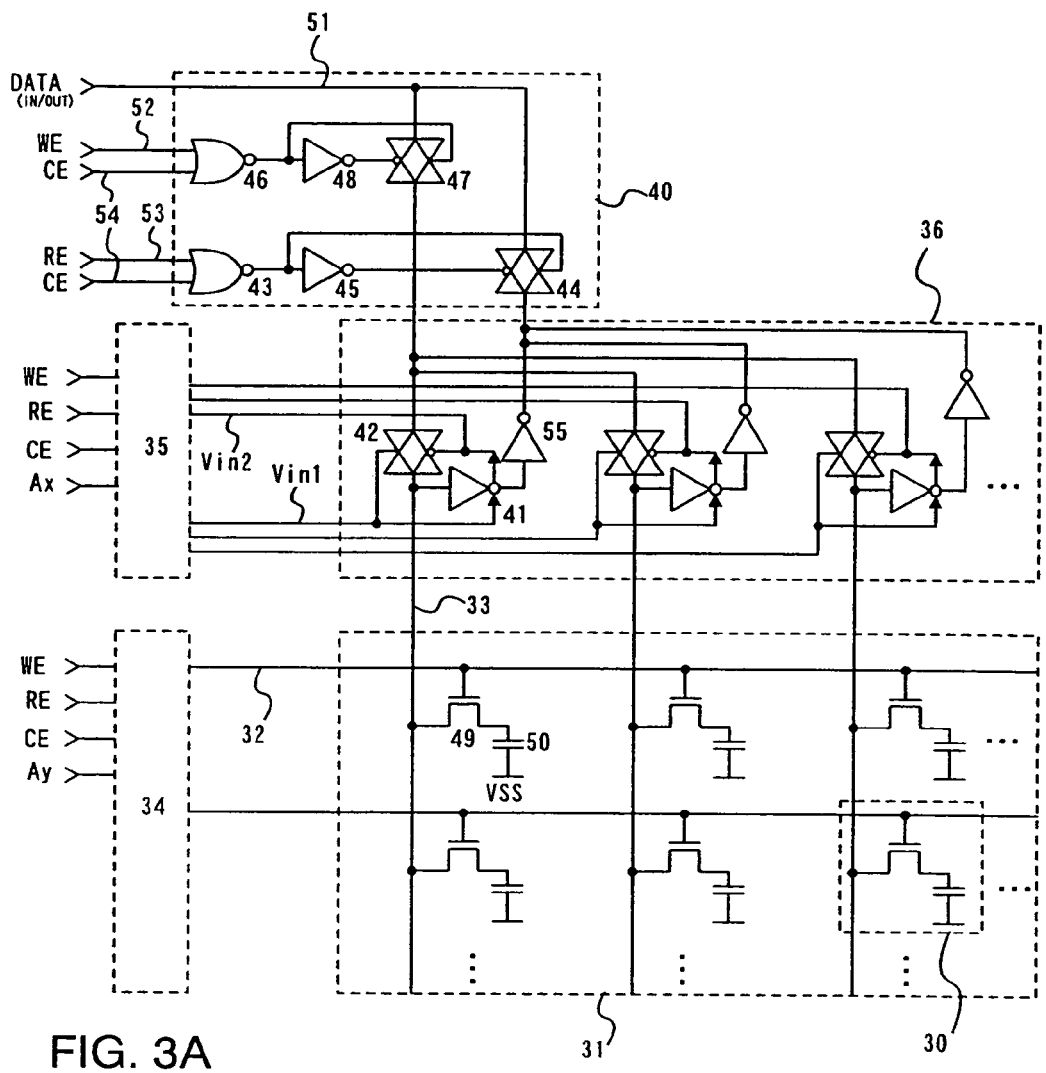
FIGS. 3A and 3B are diagrams showing the memory (Read/Write memory) of the invention and a driving method thereof (Embodiment Mode 2).
Figure 3B:
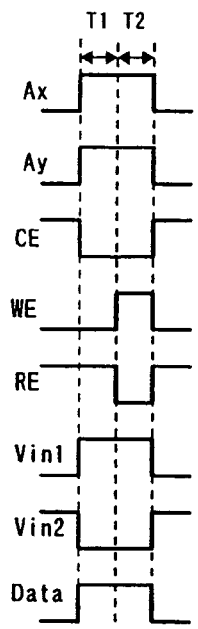

Note that FIG. 3A shows the case of using analog switches as the switches 42, 44, and 47 and inverters 45 and 48 are provided with them additionally. Also, NORs are used as the logic circuits 43 and 46. Moreover, an inverter 55 is disposed additionally in order to adjust logic of a data signal.

In FIG. 3A, a potential of an output node of the column decoder 35 corresponding to x-th column is Ax, while a potential of an output node of the row decoder 34 corresponding to y-th row is Ay. Potentials of signals to be inputted to predetermined transistors configuring the clocked inverter 41 and the analog switch 42 are Vin1 and Vin2 respectively. Vin1 and Vin2 have opposite potentials to each other. A potential of the data line 51 is Data. FIG. 3B shows a timing chart showing changes over time of the aforementioned Ax, Ay, CE, WE, RE, Vin1, Vin2, and Data. Hereinafter described are operations in a period T1 in which data is written to the memory cells 30 and period T2 in which data is read from the memory cells 30.

In the period T1, a signal of H-level is supplied to Vin1 and a signal of L-level is supplied to Vin2, which are inputted to predetermined transistors configuring the clocked inverter 41 and the analog switch 42. At this time, the analog switch 42 becomes conductive and the clocked inverter 41 becomes an operating state.

A NOR 46 which is inputted with a CE signal of L-level and a WE signal of L-level outputs a signal of H-level. The signal of H-level is inputted to predetermined transistors of the inverter 48 and the analog switch 47, which makes the analog switch 47 conductive.

On the other hand, a NOR 43 which is inputted with a CE signal of L-level and an RE signal of H-level outputs a signal of L-level. The signal of L-level is inputted to predetermined transistors of the inverter 45 and the analog switch 44, which makes the analog switch 44 non-conductive.

Further, a signal of H-level is inputted from the row decoder 34 to the word line 32 disposed in y-th row and the word line 32 of y-th row is selected. In this manner, the memory cell 30 disposed at coordinates (x, y) is selected.

A transistor 49 in the memory cell 30 disposed at coordinates (x, y) is turned ON by a potential of the word line 32 and data corresponding to the capacitor 50 is written from the data line 51 via the analog switches 47 and 42, and the bit line 33. Shown here as an example is the case of writing data of "1", therefore, the potential of the data line 51 is H-level.

In the period T2, a signal of H-level is supplied to Vin1 and a signal of L-level is supplied to Vin2 as in the period T1, which are inputted to predetermined transistors configuring the clocked inverter 41 and the analog switch 42. At this time, the analog switch 42 becomes conductive and the clocked inverter 41 becomes operating state.

The NOR 46 inputted with a CE signal of L-level and a WE signal of H-level outputs a signal of L-level. The signal of L-level is inputted to predetermined transistors of the inverter 48 and the analog switch 47, which makes the analog switch 47 non-conductive.

On the other hand, the NOR 43 inputted with a CE signal of L-level and an RE signal of L-level outputs a signal of H-level. The signal of H-level is inputted to predetermined transistors of the inverter 45 and the analog switch 44, which makes the analog switch 44 conductive.

A signal of H-level is inputted from the row decoder 34 to the word line 32 disposed in y-th row and the word line 32 of y-th row is selected. In this manner, the memory cell disposed at coordinates (x, y) is selected.

A transistor 49 in the memory cell 30 disposed at coordinates (x, y) is turned ON by a potential of the word line 32 and data read from the capacitor 50 is transferred to the data line 51 via the bit line 33, the clocked inverter 41, the inverter 55 and the analog switch 44. Shown here as an example is the case of reading data of "1", therefore, the potential of the data line 51 is H-level.

It is one of the features of the invention having the aforementioned configuration that the selection of the bit line and amplification of a signal supplied from the memory cell are carried out by one clocked inverter 15. This feature contributes to improve the reading speed of a memory drastically. Further, the invention using a clocked inverter having a small number of elements can contribute to improve the yield. Also, mounting area can be reduced due to the reduced number of elements. Moreover, the invention using a clocked inverter with one input can reduce the burden imposed upon peripheral circuitry because of the reduced signals to be controlled, which allows to reduce the number of lead wirings, for example, and the reliability is improved.

Embodiment 1

Figure 4A:
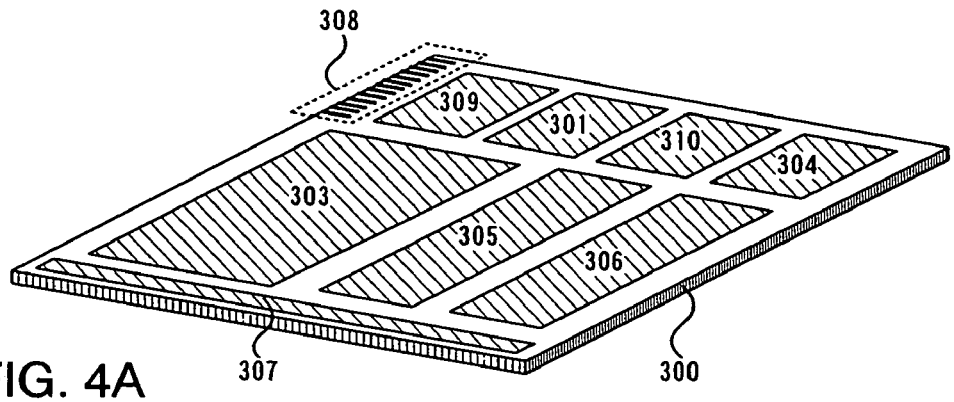
FIGS. 4A to 4C are views of a microprocessor and a display panel to which the invention is applied.

A configuration example of a microprocessor (MPU) to which the invention is applied is described with reference to FIG. 4A. An MPU shown in FIG. 4A comprises a CPU 301, a main memory 303, a clock controller 304, a cache controller 305, a serial interface 306, an I/O port 307, a terminal 308, an interface 309, a cache memory 310 and the like on a substrate 300. The invention is applied to configurations of the main memory 303 and the cache memory 310, and driving methods thereof.

According to the aforementioned configuration, the substrate 300 may be formed of a silicon wafer, a quartz substrate, a glass substrate, a metal substrate, a stainless substrate, a plastic substrate and the like. When using a substrate formed of quartz, glass, metal, stainless material and the like, it is preferable to form each circuit by using an element comprising a polycrystalline semiconductor formed by a predetermined crystallization process after forming an amorphous semiconductor (a-Si) on the substrate. By using a continuous oscillation laser in the crystallization process, a polycrystalline semiconductor of large grain size with less crystal defects can be obtained. An element formed of this polycrystalline semiconductor enables a high speed drive because of good mobility and response speed. Thus, operating frequency of an element can be improved than before and high reliability can be obtained because of less variations in characteristics. Therefore, by using an element comprising a polycrystalline semiconductor formed by the continuous oscillation laser after forming an amorphous semiconductor on an inexpensive glass substrate, a superior MPU which is inexpensive and capable of high speed operation can be provided. Further, in the case of using a substrate formed of a material which exhibits low heat resistance such as plastic, it is preferable to attach an element by a peeling method. A plastic substrate enables a variety of applications by virtue of light weight and flexibility.

There may be a plurality of CPUs 301. By processing in parallel using a plurality of CPUs 301, operating speed can be improved. In that case, when processing speeds of the CPUs 301 are not uniform, a problem may occur as a whole process. Therefore, it is preferable to balance the processing speed of each slave CPU 301 by using a master CPU.

It is preferable to use a memory superior in cost reduction and large capacity (preferably a DRAM) as the main memory 303 and a memory which is capable of operating at a high speed (preferably an SRAM) as the cache memory 310. By interposing the cache memory 310 between the CPU 301 and the main memory 303 as the aforementioned configuration, the CPU 301 accesses the cache memory 310 and can operate at a high speed regardless of the speed of the main memory 303.

The invention is not limited to the application as a memory in an MPU, but it is also preferable to apply the invention to a video RAM which is used for a driver circuit of a display device and a large capacity memory which is required in an image processing circuit. Besides, the invention can be applied to a large capacity memory or a memory for compact use in various system LSIs as well.

Embodiment 2

Figure 4B:
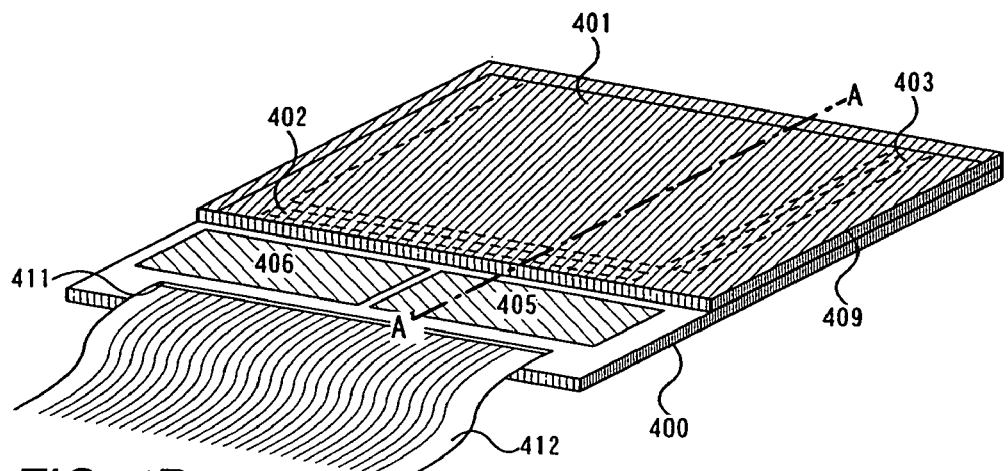

In this embodiment, a panel over which a pixel portion, a driver circuit for controlling the pixel portion, a memory and a CPU are mounted on the same surface is described with reference to FIGS. 4B and 4C. FIG. 4B is a top plan view of the panel and FIG. 4C is a cross sectional view of FIG. 4B taken along a line A–A'.

FIG. 4B is an exterior view of the panel comprising a pixel portion 401 in which a plurality of pixels are arranged in matrix and a signal line driver circuit 402 and a scan line driver circuit 403 are provided in the periphery of the pixel portion 401 over a glass substrate 400. Further, a CPU 406 and a memory 405 which corresponds to a VRAM (a memory dedicated to the purpose of displaying image), a RAM, and a ROM are provided over the glass substrate 400. Furthermore, an input terminal portion 411 for supplying a signal to control the signal line driver circuit 402 and the scan line driver circuit 403, the memory 405 and the CPU 406 is provided over the glass substrate 400. A signal such as a video signal is supplied from an external circuit to the input terminal 411 via an FPC 412. The invention is applied to a configuration of the memory 405 and a driving method thereof.

With a sealing member (not shown) provided so as to surround the pixel portion 401, the signal line driver circuit 402 and the scan line driver circuit 403, the glass substrate 400 and a counter substrate 409 are bonded to each other. The counter substrate 409 may be provided only over the pixel portion 401, the signal line driver circuit 402 and the scan line driver circuit 403, or over the whole surface of the glass substrate 400. However, using a CPU 406 which could generate heat, it is preferable to provide a cooling plate to be in contact with it.

Figure 4C:
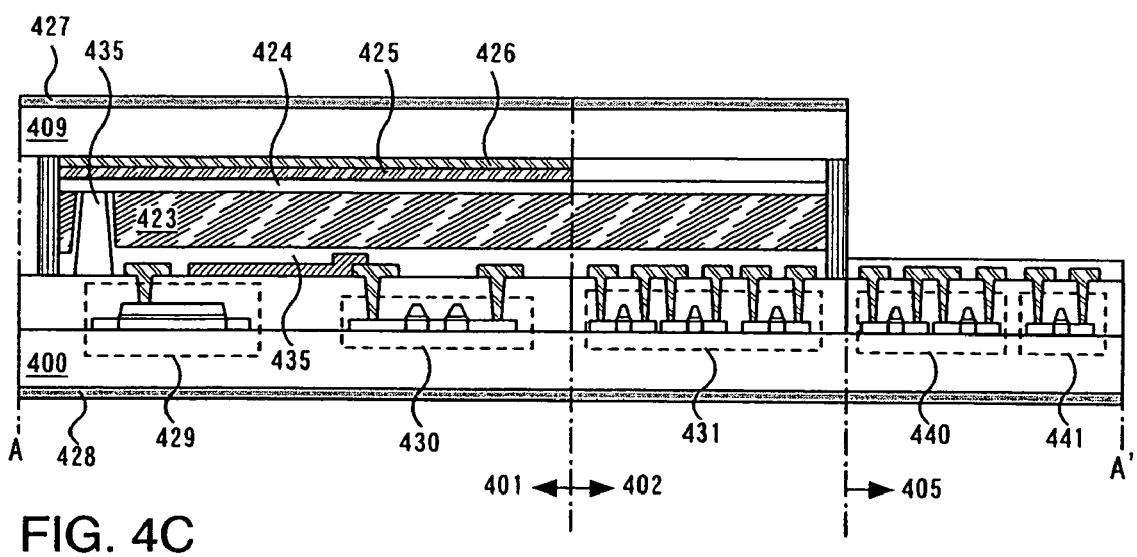

FIG. 4C is the cross sectional view of the panel. The pixel portion 401, the signal line driver circuit 402 and the memory 405 are provided over the glass substrate 400. The pixel portion 401 comprises a transistor 430 and a capacitor 429, the signal line driver circuit 402 comprises a group of elements 431 formed of a CMOS circuit and the like, and the memory 405 comprises a CMOS circuit 440 configuring the peripheral circuitry and a transistor 441 included in a memory cell.

A spacer 422 is provided between the glass substrate 400 and the counter substrate 409. A rubbed alignment film 435, a liquid crystal film 423, an alignment film 424, a counter electrode 425 and a color filter 426 are provided over the pixel portion 401. Polarizing panels 428 and 429 are provided over the glass substrate 400 and the counter substrate 409.

The elements configuring a circuit over the glass substrate 400 are formed of a polycrystalline semiconductor (polysilicon) which has superior characteristics such as mobility as compared to an amorphous semiconductor, thereby a monolithic structure over the same surface can be achieved. In particular, it is preferable to use a thin film transistor of which channel portion is formed of a polycrystalline semiconductor.

Further, functional circuits such as a CPU and a memory are integrally formed over the same glass substrate 400 as well as the pixel portion and the driver circuits. Such a panel is referred to as a System on Panel by which a multi-function of a system can be realized.

The panel having the aforementioned structure can be compact, lightweight, and thin as the number of external ICs to be connected is reduced. It is very efficient to apply this panel to a portable terminal which has been rapidly widespread in recent years.

Note that the panel using a liquid crystal element as a display element is described in this embodiment, however, the invention is not limited to this. The invention can be applied to a panel using another display element such as a light emitting element as well.

Embodiment 3

Examples of electronic apparatuses to which the invention is applied include a digital camera, an audio reproducing apparatus such as a car audio system, a personal computer, a game machine, a portable information terminal, an image reproducing apparatus provided with a recording medium, such as a home game machine, and the like. Specific examples of these electronic apparatuses are described with reference to FIGS. 5A to 5E.

FIG. 5A illustrates a portable terminal comprising a body 9101, a display portion 9102 and the like. FIG. 5C illustrates a PDA (Personal Digital Assistant) comprising a body 9201, a display portion 9202 and the like. FIG. 5D illustrates a goggle type display comprising a body 9301, a display portion 9302 and the like. FIG. 5E illustrates a portable game machine comprising a body 9401, a display portion 9402 and the like.

Each of the panels including the display portions 9102, 9202, 9302 and 9402 comprises a driver circuit 9104 and a functional circuit 9103 such as a CPU and a memory as shown in FIG. 5B. The invention is applied to a configuration of a memory of the functional circuit 9103 and a driving method thereof. In this manner, an electronic apparatus having a panel over which functional circuits as well as a driver circuit are integrally formed can be compact, lightweight, and thin as the number of external ICs to be connected can be reduced, therefore, it is efficient for a portable terminal.

It is efficient to use a self-luminous light emitting element as a display element provided in the display portions 9102, 9202, 9302 and 9402 in the aforementioned electronic apparatuses since no backlight and the like are required. Thus, it is preferable as compared to the case of using a liquid crystal element in the respect of compactness, lightweight and thinness.

Next, a specific example of an IC card is described with reference to FIG. 5F. FIG. 5F illustrates a contact type IC card comprising a body 9601, an IC chip 9602, and a module terminal 9603. The IC chip 9602 comprises a RAM 9604, a ROM 9605, a CPU 9606, an EEPROM 9607 and the like. The invention is applied to a structure of the IC chip 9602 and a driving method thereof.

This application is based on Japanese Patent Application serial no. 2003-291811 filed in Japan Patent Office on Aug. 11, 2003, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A memory comprising:
    a bit line;
    a word line crossing the bit line;
    a memory cell electrically connected to the bit line and to the word line, including a memory element;
    a column decoder; and
    a selector including a clocked inverter having a plurality of transistors electrically connected in series between a first power source and a second power source,
    wherein:
    an input node of the clocked inverter is connected to the bit line,
    an output node of the clocked inverter is electrically connected to a data line,
    the plurality of transistors comprise a P-type transistor and a N-type transistor,
    a gate electrode of the P-type transistor and a gate electrode of the N-type transistor are electrically connected to the column decoder, and
    a sense amplifier is not interposed between the bit line and the input node of the clocked inverter.

2. A memory according to claim 1, wherein the memory is a Read Only Memory.

3. A memory according to claim 1, wherein the selector comprises a thin film transistor.

4. A memory according to claim 1, further comprising a Read/Write circuit including a second analog switch and a third analog switch, wherein:

the selector further comprises a first analog switch, the bit line is electrically connected to the data line via the clocked inverter and the second analog switch, or via the first analog switch and the third analog switch, the first analog switch is interposed between the bit line and the third analog switch, the second analog switch is interposed between the clocked inverter and the data line, the third analog switch is interposed between the first analog switch and the data line.

5. A memory comprising:

a bit line;

a word line crossing the bit line;

a memory cell electrically connected to the bit line and to the word line, including a memory element;

a column decoder; and a selector including a clocked inverter having a plurality of transistors electrically connected in series between a first power source and a second power source, wherein:

an input node of the clocked inverter is connected to the bit line, an output node of the clocked inverter is electrically connected to a data line, the plurality of transistors comprise a P-type transistor and a N-type transistor, one electrode selected from a gate electrode of the P-type transistor and a gate electrode of the N-type transistor is electrically connected to the column decoder, the other electrode is electrically connected to the column decoder via an inverter, and a sense amplifier is not interposed between the bit line and the input node of the clocked inverter.

6. A memory according to claim 5, wherein the memory is a Read Only Memory.

7. A memory according to claim 5, wherein the selector comprises a thin film transistor.

8. A memory according to claim 5, further comprising a Read/Write circuit including a second analog switch and a third analog switch, wherein:

the selector further comprises a first analog switch, the bit line is electrically connected to the data line via the clocked inverter and the second analog switch, or via the first analog switch and the third analog switch, the first analog switch is interposed between the bit line and the third analog switch, the second analog switch is interposed between the clocked inverter and the data line, the third analog switch is interposed between the first analog switch and the data line.

9. A memory comprising:

a bit line;

a word line crossing the bit line;

a memory cell electrically connected to the bit line and to the word line, including a memory element;

a column decoder;

a selector including a first switch and a clocked inverter; and a Read/Write circuit including a second switch and a third switch, wherein:

the bit line is electrically connected to a data line via the clocked inverter and the second switch, or via the first switch and the third switch, a gate electrode of a first transistor included in the first switch is electrically connected to the column decoder, a gate electrode of a second transistor included in the second switch is electrically connected to a Read Enable signal line, and a gate electrode of a third transistor included in the third switch is electrically connected to a Write Enable signal line.

10. A memory according to claim 9, wherein the first to third switches are analog switches.

11. A memory according to claim 9, wherein the memory is a Random Access Memory.

12. A memory comprising:

a bit line;

a word line crossing the bit line;

a memory cell electrically connected to the bit line and to the word line, including a memory element;

a column decoder;

a selector including a first switch and a clocked inverter; and a Read/Write circuit including a second switch, a third switch, a first logic circuit and a second logic circuit, wherein:

the bit line is electrically connected to a data line via the clocked inverter and the second switch, or via the first switch and the third switch, a gate electrode of a first transistor included in the first switch is electrically connected to the column decoder, a gate electrode of a second transistor included in the second switch is electrically connected to an output node of the first logic circuit, a gate electrode of a third transistor included in the third switch is electrically connected to an output node of the second logic circuit, a first input node of the first logic circuit is electrically connected to a Read Enable signal line, a second input node of the first logic circuit is electrically connected to a Chip Enable signal line, a first input node of the second logic circuit is electrically connected to a Write Enable signal line, and a second input node of the second logic circuit is electrically connected to a Chip Enable signal line.

13. A memory according to claim 12 wherein the first to third switches are analog switches.

14. A memory according to claim 12, wherein the first and second logic circuits are NORs.

15. A memory according to claim 12, wherein the memory is a Random Access Memory.

16. A driving method of a memory comprising:

a bit line;

a word line crossing the bit line;

a memory cell electrically connected to the bit line and to the word line, including a memory element;

a column decoder;

a selector including a clocked inverter having a plurality of transistors electrically connected in series between a first power source and a second power source, wherein:

an input node of the clocked inverter is connected to the bit line, an output node of the clocked inverter is electrically connected to a data line, the plurality of transistors comprise a P-type transistor and a N-type transistor, a gate electrode of the P-type transistor and a gate electrode of the N-type transistor are electrically connected to the column decoder, a sense amplifier is not interposed between the bit line and the input node of the clocked inverter, the clocked inverter is put into an operating state by inputting a signal from the column decoder to the gate electrode of the P-type transistor and the gate electrode of the N-type transistor, and a data signal is inputted from the memory cell to the input node of the clocked inverter via the bit line, and an amplified data signal is outputted from the output node of the clocked inverter.

17. A driving method of a memory according to claim 16, wherein the selector comprises a thin film transistor.

18. A memory according to claim 16, further comprising a Read/Write circuit including a second analog switch and a third analog switch,
wherein:
the selector further comprises a first analog switch,
the bit line is electrically connected to the data line via the clocked inverter and the second analog switch, or via the first analog switch and the third analog switch,
the first analog switch is interposed between the bit line and the third analog switch,
the second analog switch is interposed between the clocked inverter and the data line,
the third analog switch is interposed between the first analog switch and the data line.

19. A driving method of a memory comprising:
a bit line;
a word line crossing the bit line;
a memory cell electrically connected to the bit line and to the word line, including a memory element;
a column decoder; and
a selector including a clocked inverter having a plurality of transistors electrically connected in series between a first power source and a second power source,
wherein:
an input node of the clocked inverter is connected to the bit line,
an output node of the clocked inverter is electrically connected to a data line,
the plurality of transitors comprise a P-type transistor and a N-type transistor,
one electrode selected from a gate electrode of the P-type transistor and a gate electrode of the N-type transistor is electrically connected to the column decoder,
the other electrode is electrically connected to the column decoder via an inverter,
a sense amplifier is not interposed between the bit line and the input node of the clocked inverter,
the clocked inverter is into an operating state by inputting a signal from the column decoder to the gate electrode of the P-type transistor and the gate electode of the N-type transistor, and
a data signal is inputted from the memory cell to the input node of the clocked inverter via the bit line, and an amplified data signal is outputted from the output node of the clocked inverter.

20. A drining method of a memory according to claim 19 wherein the selector comprises a thin film transistor.

21. A memory according to claim 19, further comprising a Read/Write circuit including a second analog switch and a third analog switch,
wherein:
the selector further comprises a first analog switch,
the bit line is electrically connected to the data line via the clocked inverter and the second analog switch, or via the first analog switch and the third analog switch,
the first analog switch is interposed between the bit line and the third analog switch,
the second analog switch is interposed between the clocked inverter and the data line,
the third analog switch is interposed between the first analog switch and the data line.

22. A driving method of a memory comprising:
a bit line;
a word line crossing the bit line;
a memory cell electrically connected to the bit line and to the word line, including a memory element;
a column decoder;
a selector including a first switch and a clocked inverter; and
a Read/Write circuit including a second switch and a third switch,
wherein:
the bit line is electrically connected to a data line via the clocked inverter and the second switch, or via the first switch and the third switch,
a gate electrode of a first transistor included in the first switch is electrically connected to the column decoder,
a gate electrode of a second transistor included in the second switch is electrically connected to a Read Enable signal line,
a gate electrode of a third transistor included in the third switch is electrically connected to a Write Enable signal line,
a Read Enable signal is inputted to make a second switch conductive,
a Write Enable signal is inputted to make a third switch non-conductive, and
a data signal is inputted from the memory cell to an input node of the clocked inverter via the bit line, and an amplified data signal is outputted from an output node of the clocked inverter.

23. A driving method of a memory comprising:
a bit line;
a word line crossing the bit line;
a memory cell electrically connected to the bit line and to the word line, including a memory element;
a column decoder;
a selector including a first switch and a clocked inverter; and
a Read/Write circuit including a second switch, a third switch, a first logic circuit and a second logic circuit,
wherein:
the bit line is electrically connected to a data line via the clocked inverter and the second switch, or via the first switch and the third switch,
a gate electrode of a first transistor included in the first switch is electrically connected to the column decoder,
a gate electrode of a second transistor included in the second switch is electrically connected to an output node of the first logic circuit,
a gate electrode of a third transistor included in the third switch is electrically connected to an output node of the second logic circuit,
a first input node of the first logic circuit is electrically connected to a Read Enable signal line,
a second input node of the first logic circuit is electrically connected to a Chip Enable signal line,
a first input node of the second logic circuit is electrically connected to a Write Enable signal line,
a second input node of the second logic circuit is electrically connected to a Chip Enable signal line, a Read Enable signal is inputted to make a second switch non-conductive, a Write Enable signal is inputted to make a third switch conductive, and a data signal is inputted from the data line to the memory cell via the first switch, the third switch, and the bit line.

* * * * *